United States Patent [19]
Seng et al.

[11] Patent Number: 6,085,327
[45] Date of Patent: Jul. 4, 2000

[54] AREA-EFFICIENT INTEGRATED SELF-TIMING POWER START-UP RESET CIRCUIT WITH DELAY OF THE START-UP RESET UNTIL THE SYSTEM CLOCK IS STABILIZED

[75] Inventors: Yap Hwa Seng; Uday Dasgupta; Chan Chee Oei, all of Singapore, Singapore

[73] Assignee: Tritech Microelectronics, Ltd., Singapore, Singapore

[21] Appl. No.: 09/058,124

[22] Filed: Apr. 10, 1998

[51] Int. Cl.[7] ........................................ G06F 1/26
[52] U.S. Cl. ................... 713/300; 327/143; 307/3
[58] Field of Search ...................... 713/300, 400, 713/500; 365/189.01, 189.05, 189.06, 226, 228; 307/272.3; 327/143

[56] References Cited

U.S. PATENT DOCUMENTS

| | | | |
|---|---|---|---|
| 4,900,950 | 2/1990 | Dubujet | 307/272.3 |
| 5,148,051 | 9/1992 | Deierling et al. | 307/272.3 |
| 5,343,085 | 8/1994 | Fujimoro et al. | 307/272.3 |
| 5,446,403 | 8/1995 | Witkowski | 327/143 |
| 5,467,037 | 11/1995 | Kumar et al. | 327/142 |
| 5,510,741 | 4/1996 | Childs | 327/143 |
| 5,537,055 | 7/1996 | Smith et al. | 326/8 |
| 5,739,708 | 4/1998 | LeWalter | 327/143 |
| 5,821,788 | 10/1998 | Pascucci et al. | 327/143 |

*Primary Examiner*—Glenn A. Auve
*Attorney, Agent, or Firm*—George O. Saile; Stephen B. Ackerman

[57] ABSTRACT

A circuit and a method are disclosed for a power start-up reset circuit which is self-timing and which can be fully integrated in a standard CMOS or BiCMOS process along with other digital circuits. The circuit provides a system reset signal which is issued only after all circuit have stabilized by making the issuance of this system reset signal dependent on an oscillator becoming stable and a subsequent count of a fixed number of system clock cycles derived from that oscillator.

14 Claims, 4 Drawing Sheets

AREA-EFFICIENT INTEGRATED SELF-TIMING POWER START-UP RESET CIRCUIT WITH DELAY OF THE START-UP RESET UNTIL THE SYSTEM CLOCK IS STABILIZED

BACKGROUND OF THE INVENTION

1. Field of the Invention

The invention relates to resetting of digital circuit, and more particularly to integrated circuits generating self-timed resets upon power start-up.

2. Description of the Related Art

Digital circuits require a start-up reset in order to set a system to a know initial state. Conventional power-detection circuits for generating the reset signal use large value discrete resistors and capacitors which is not area-efficient in integrated circuits. In addition, power consumption is higher than desired and an external reset pin and extra external discrete components complicate the design.

Three U.S. Patents are known which deal with power-on reset circuits. U.S. Pat. No. 5,343,085 (Fujimoro, et al.) discloses a power-on reset circuit for an integrated circuit having a pulse generator, an oscillator, and a counter for creating a relatively long reset period. The pulse generator, however, appears to use a discrete resistor and capacitor. U.S. Pat. No. 5,148,051 (Deierling et al.) provides a power up circuit for an IC which separately tests the voltage level and delays the power-up reset, but differs from the present invention in that duration of the power-up reset depends mainly on a string of circuit delays. U.S. Pat. No. 4,900,950 (Dubujet) describes a power-on reset circuit having an oscillator, but the oscillator is used to provide a voltage higher than the supply voltage and application of power is delayed until the supply voltage has reached an acceptable value.

SUMMARY OF THE INVENTION

It is an object of the present invention to provide a circuit and a method for a self-timing power start-up reset circuit which can be fully integrated in a standard CMOS or BiCMOS process along with other digital circuits.

Another object of the present invention is to provide a low power, low current (less than 20 microampere) solution.

A further object of the present invention is to provide a cost-effective solution by eliminating the need for an external reset pin and extra external discrete components.

These objects have been achieved by providing a SYSTEM RESET signal which is issued only after all circuit have stabilized by making the issuance of this SYSTEM RESET signal dependent on an oscillator becoming stable and a subsequent count of a fixed number of SYSTEM CLOCK cycles derived from that oscillator.

DESCRIPTION OF THE PREFERRED EMBODIMENT

Figure 1:
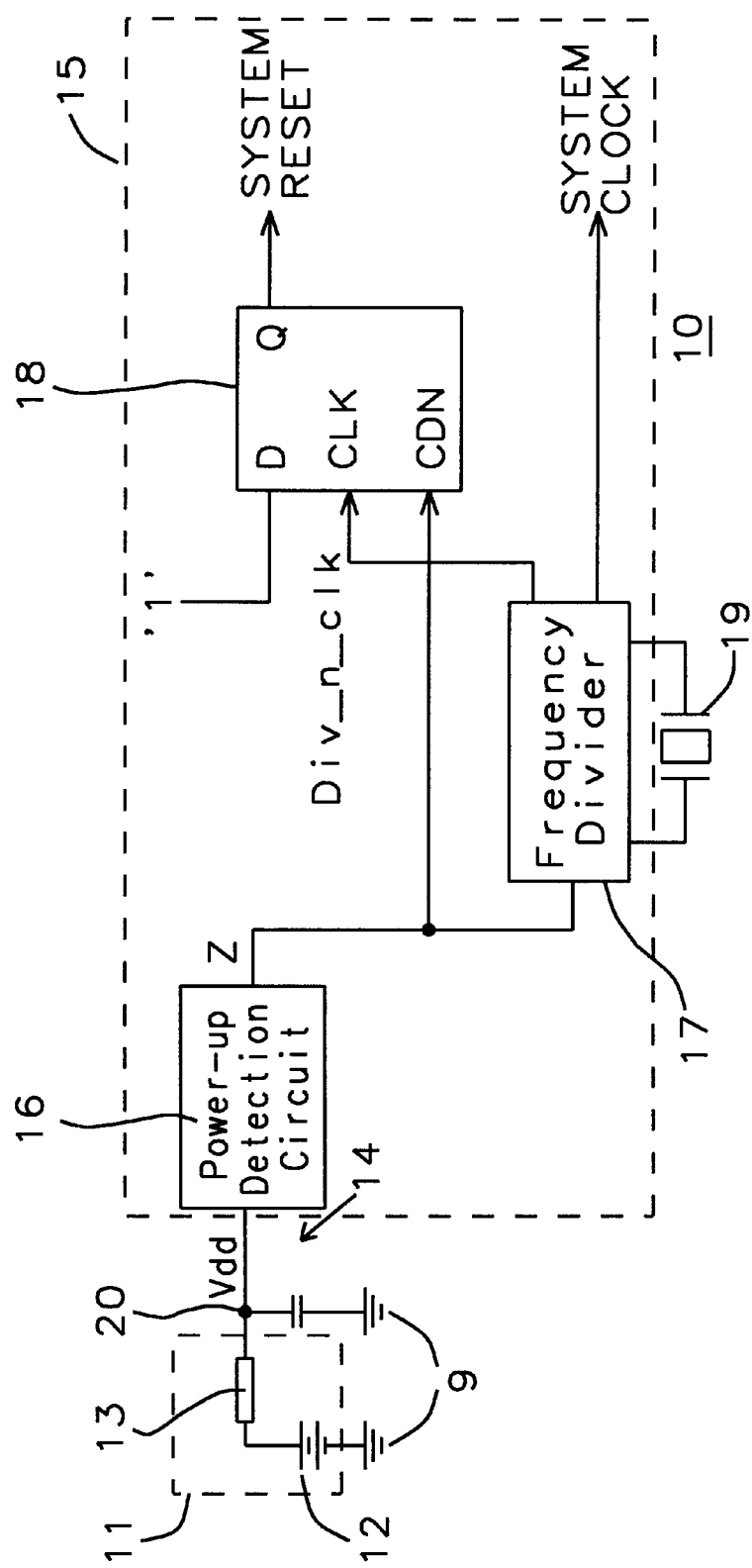
FIG. 1 is a block diagram of the present invention.

Referring now to FIG. 1, we show a block diagram illustrating the principal components according to the preferred embodiment of the invention. Circuit 10 comprises a power source 11 and a decoupling capacitor 14, which are connected to integrated circuit 15. Integrated circuit 15, generating a self-timing power start-up reset, consists of a power-up detection circuit 16 producing a RESET pulse at output Z after power start-up i.e. when a battery 11 or a power supply (not shown) is attached to 16. Frequency divider 17 receives the RESET pulse and produces subsequently a SYSTEM CLOCK and a Div_n_clk pulse. Bistable circuit 18 receives RESET pulse 21 and Div_n_clk pulse 22 and produces a SYSTEM RESET signal. The SYSTEM RESET signal is started by the RESET pulse and is ended by the Div_n_clk pulse. The SYSTEM RESET signal remains active until all circuits affected by the power start-up have become stabilized. Frequency divider 17 may either have its own oscillator or receive oscillations from an external oscillator 19, such as a crystal clock as shown in FIG. 1. The choice of an internal or external oscillator depends on how stable the frequency needs to be and cost considerations.

Still referring to FIG. 1, we now describe the integrated circuit 15 in more detail. The input 20 of the power-up detection circuit 16 is its power rail Vdd. After the power-up detection circuit is connected to a source of power, output Z produces a RESET pulse of duration T1. Frequency divider 17 in addition to an internal or external oscillator, as already mentioned above, also has a frequency divider to divide or reduce the oscillator frequency. The frequency divider primarily consists of a series of flip-flops dividers where each stage halves the frequency of the input signal. The bistable circuit 18 (typically a D-type flip-flop) has its first input D connected to a logical 1 voltage level. The second input CLK is connected to the Div_n_clk output of frequency divider 17, the third input CDN is connected to output Z of the power-up detection circuit. Output Q produces signal SYSTEM RESET.

Integrated circuit 15 can be implemented in CMOS or BiCMOS technology and typically consumes a current of less than 20 microampere where the source of power can range from 2.2 volt to 3.7 volt for CMOS or from 4.5 volt to 5.5 volt for BiCMOS. The power-up detection circuit will detect power-up when the voltage slope is at least 0.8 volt per microsecond. The correct voltage slope can be realized by the choice of RC time-constant consisting of the internal resistance $R_i$ 13 of the power source (or battery 11 per FIG. 1) and the power supply de-coupling capacitor 14. Capacitor 14 is connected between point 20 and ground 9, or a reference potential. Battery 11 comprises a voltage source 12 in series with internal resistance 13 and is connected to point 20 on one side and to ground 9, or a reference potential, on the other side.

The pulse Div_n_clk is generated by a "divide by n" circuit after a count of at least 2 cycles. The number of cycles required to insure a complete system reset depends on the invention's oscillator start-up behavior and the host's test time considerations i.e. how long it takes a given circuit using this invention to go through a self-test or other such sequence. Once the required count is reached SYSTEM RESET will be turned off by Div_n_clk signal.

Figure 2:
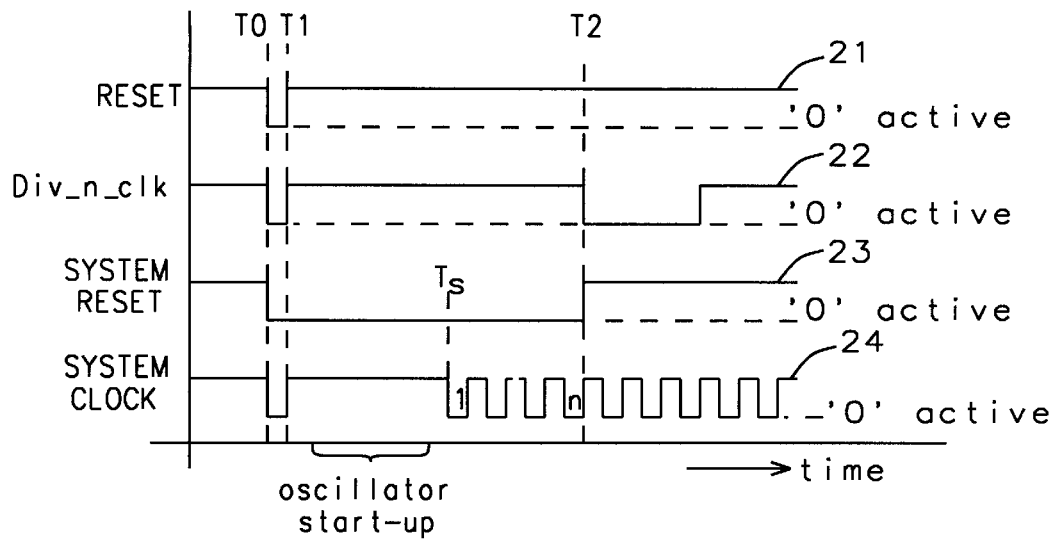
FIG. 2 is a view of the input and output signals of the circuit as shown in FIG. 1.

Referring now to FIG. 2, we describe the waveshapes produced by integrated circuit 15. The time between the ordinate, and time TO represents the prior state of integrated circuit 15 when power is on. The input voltage drops to zero at time TO and then rises to its maximum by time Ti. Logical 0 is the active level in the preferred embodiment, but logical 1 active is equally valid for some other embodiment of the present invention.

With the input voltage from a power source applied to input 20 at T0, output Z goes to logical 1 at time T1 as indicated by Curve 21. Signal "Div_n_clk" similarly goes to logical 1 at time T1 (Curve 22). The oscillator part of the frequency divider 17 goes into oscillation start-up mode some time after T1 when Vdd is available, as shown by curve 24. Oscillations are steady at time $T_s$. The time from T1 to $T_s$ depends on the type of circuit employed, the power supply voltage and other factors.

The count of "n" in the signal Div_n_clk is chosen so that the circuits have time to stabilize. Convenient divisions are those by the power of 2, i.e. $2^n$ because they require a minimum of circuits (flip-flops). Any other non-binary division is equally acceptable. However, depending on the type of integrated circuit, other counting methods or division algorithms may be more suitable.

Still referring to FIG. 2, we see that at time T2, when "n" pulses of Curve 24 have been counted, curve 22 (the "divide by n signal") has a negative transition to logical 0. This negative transition at input CLK of circuit 18 now forces Curve 23 to a logical 1, which is equal to terminating SYSTEM RESET, i.e. "not SYSTEM RESET". Curve 23 stays at logical 1, "not SYSTEM RESET", as long as power is up, because input D is tied to logical 1 and any change at input CLK has no effect.

Figure 3:
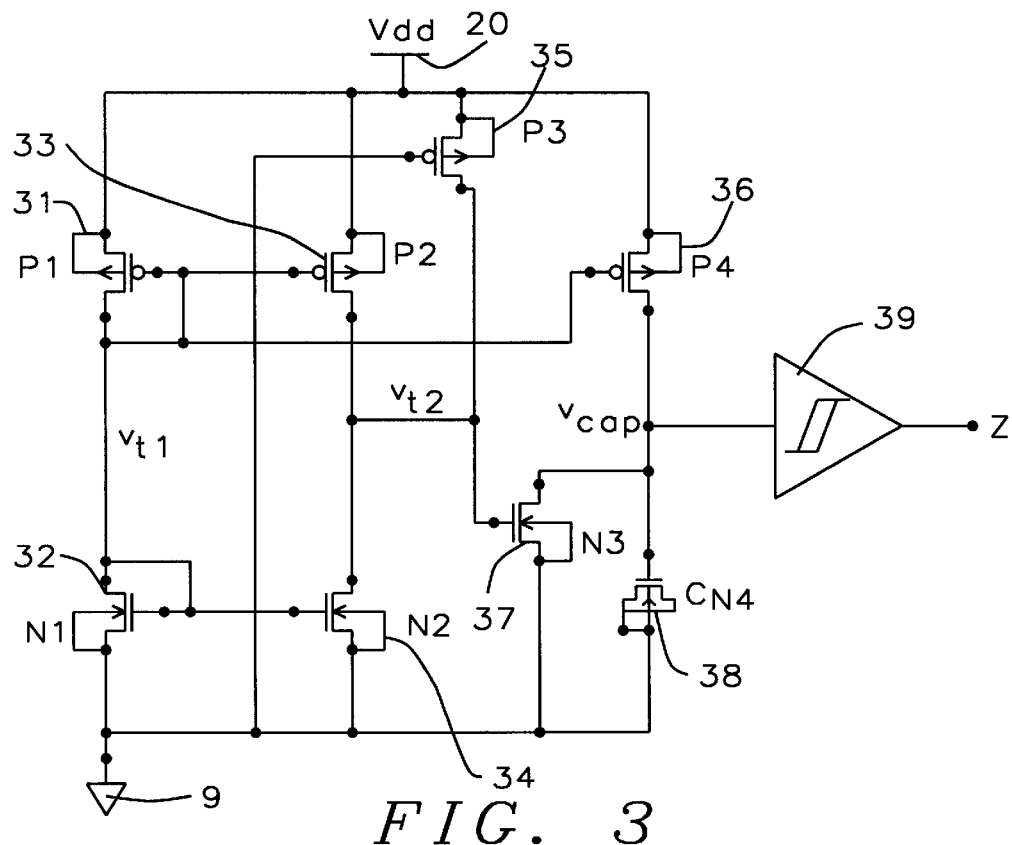
FIG. 3 is a detailed circuit diagram of the power-up detection circuit of FIG. 1.

We next describe the preferred embodiment of the power-up detection circuit 16 as illustrated in FIG. 3. This circuit is specially designed to eliminate the need for an extra external pin and extra external discrete components.

The voltage supply rail Vdd is also input 20 of power-up detection circuit 16. Ground 9, or reference potential, is the same as that of FIG. 1. P-channel transistors 31 (P1) and 33 (P2) each have their source connected to Vdd 20 and have their gates connected forming a current source where transistor 31 determines the current by having its gate and source tied together. Similarly n-channel transistors 32 (N1) and 34 (N2) each have their source connected to ground 9 and have their gates connected forming a current source where transistor 32 determines the current by having its gate and source tied together. Transistors 31 with 32 and transistors 33 with 34 are connected in series between Vdd 20 and ground 9. The point connecting transistors 31 and 32 is node $v_{t1}$ and the point connecting transistor 33 and 34 is node $v_{t2}$. P-channel transistor 35 (P3) is paralleled with transistor 33, and the gate of transistor 35 is tied to ground 9. P-channel transistor 36 (P4) and n-channel transistor 37 (N3) are also connected in series between Vdd and ground. The gate of p-channel transistor 36 is connected to the gate of transistor 31 making transistor 31 the current source for transistor 36. The gate of transistor 37 is connected to node $v_{t2}$. The connection between transistors 36 and 37 is node $v_{cap}$. N-channel transistor 38 ($C_{N4}$), wired as a capacitor by having source, drain and substrate connected, has its gate connected to node $v_{cap}$ and its other terminals tied to ground. The input and output of Schmitt trigger 39 is connected between $v_{cap}$ and output Z, which produces the signal "RESET pulse". Schmitt trigger 39 is not explained further since it is a standard circuit for those skilled in circuits.

Figure 4:
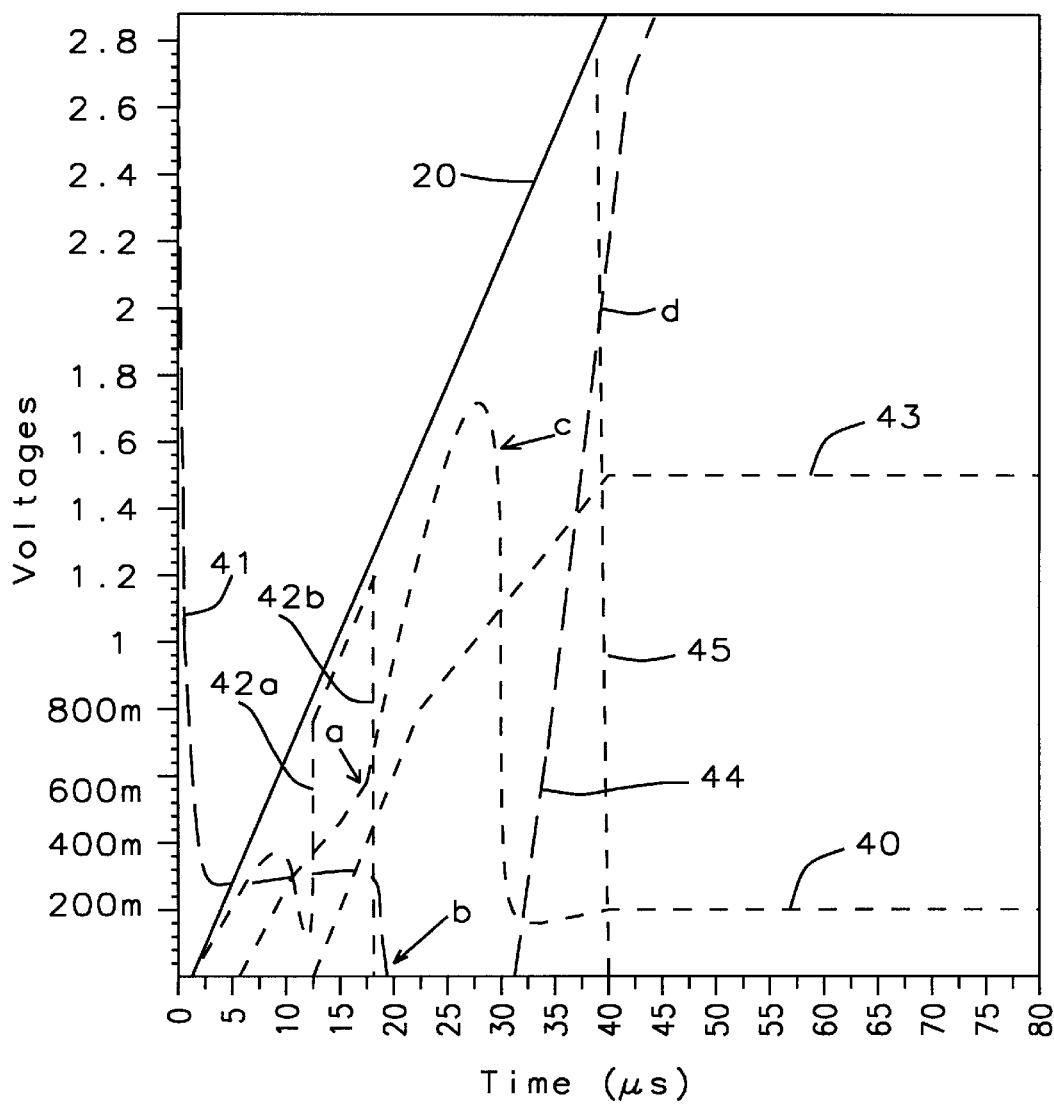
FIG. 4 is a view of the internal node signals and output signal of the circuit as shown in FIG. 3.

The circuit of FIG. 3 operates as follows. Waveshapes of certain nodes described here are identified and depicted in FIG. 4. At the time of power up, all transistors are off. The sharp dropping of Curve 41 of FIG. 4 at time 0 (representing the discharge of $C_{N4}$ at node $v_{cap}$) is the result of power having been on before time 0 and then dropping at time 0, as explained earlier when describing the waveshapes of FIG. 2. As Vdd rises (Curve 20) until Vdd>$|V_{tp3}|$, transistor 35 (P3) turns on and pulls $V_{t2}$ to Vdd (Point a of Curve 40). This turns on transistor 37 (N3), pulling down its drain ($v_{cap}$) and discharging MOS capacitor 38 ($C_{N4}$) (Point b of Curve 41) which causes output Z to reset (Curve 42b) having risen just before (Curve 42a). As Vdd rises further until Vdd>$V_{tN2}$+$|V_{tp1}|$, transistor 34 (N2) starts to turn on which pulls down node $v_{t2}$ (Point c of Curve 40) and causes transistor 37 to turn off. At the same time, transistor 36 turns on, (for its gate voltage see node $v_{t1}$, Curve 43) and charges capacitor 38 (node $v_{cap}$, Curve 44). Once node $v_{cap}$ rises above the upper threshold of the Schmitt trigger at Point d of FIG. 4, the output Z (Curve 45) will be set to high. This power-up detection circuit can operate in the temperature range of −40° C. to +80° C.

Figure 5:
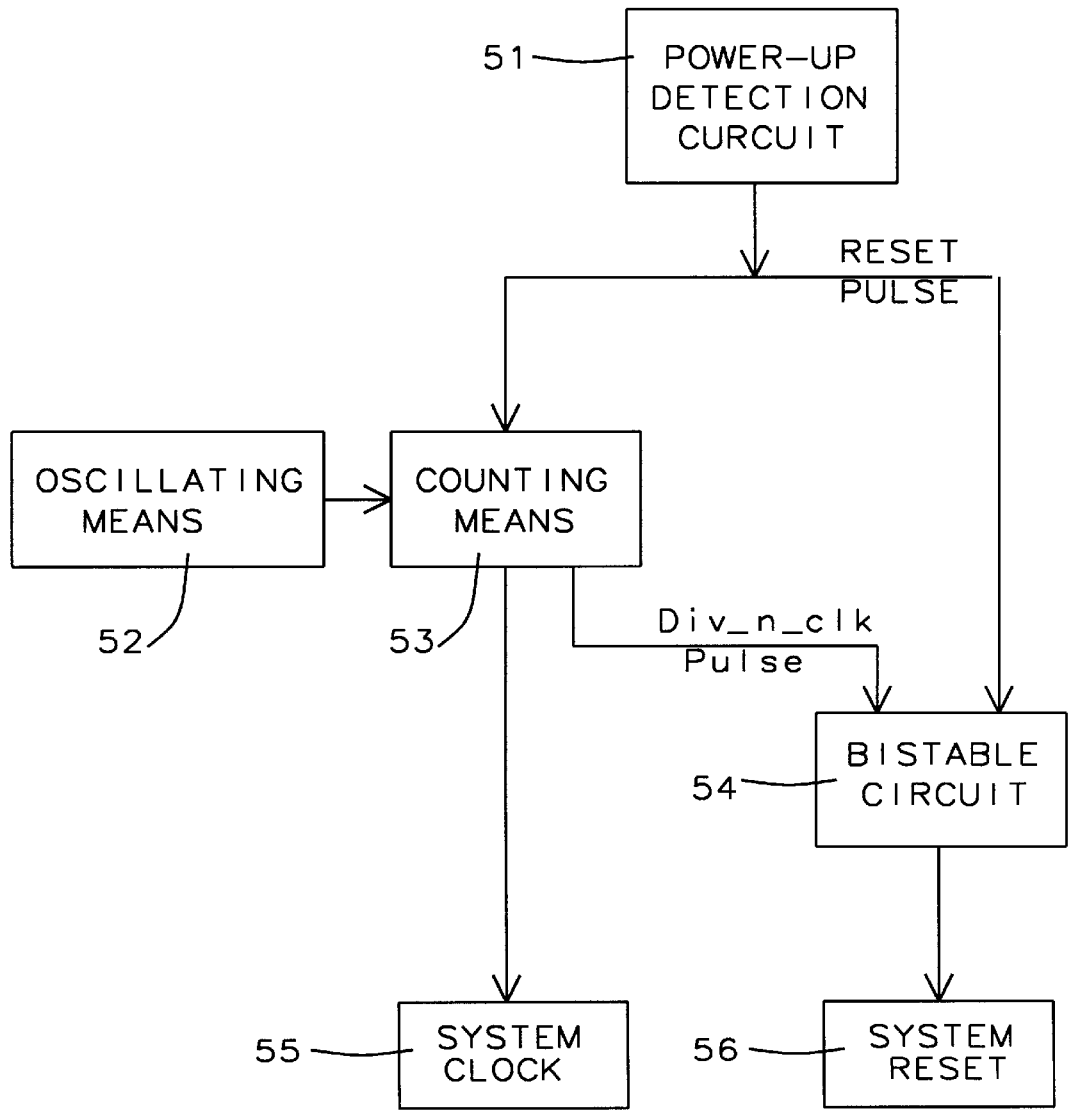
FIG. 5 is a high level block diagram of the method of the present invention.

The method the present invention of producing a self-timed SYSTEM RESET upon power start-up is illustrated in FIG. 5. Block 51 shows providing a power-up detection circuit which issues a RESET pulse after power start-up. Block 52 shows providing oscillating means to produce oscillating pulses of uniform frequency. Block 53 shows providing counting means to issue a SYSTEM CLOCK (Block 55) and a Div_n_clk pulse to Block 54, and receiving a RESET pulse from Block 51 and oscillating pulses from Block 52. Block 54 is shown providing a bistable circuit and issuing a SYSTEM RESET signal (Block 56). The method includes issuing the SYSTEM RESET signal upon receiving the RESET pulse and ending the SYSTEM RESET signal upon receiving the Div_n_clk pulse.

The method calls for the SYSTEM RESET signal to remain active until all circuits affected by the power start-up have become stabilized and that the Div_n_clk pulse provided to the bistable circuit be delayed to meet power start-up requirements of a host system.

The advantages of the present invention are:

self timing of the SYSTEM RESET signal, the duration of the SYSTEM RESET signal can be tailored to suit the oscillator start-up behavior and test time considerations, a simple and area-efficient implementation, the circuit can be fully integrated in a standard CMOS or BiCMOS process along with other digital circuits, the design results in a low power, low current (less than 20 microampere) consumption, the circuit eliminates the need of an external reset pin and extra external discrete components, either a battery or a power supply can be used as a power source, allowing the use of either an internal or external oscillator.

While the invention has been particularly shown and described with reference to the preferred embodiments thereof, it will be understood by those skilled in the art that various changes in form and details may be made without departing from the spirit and scope of the invention.

What is claimed is:

1. An integrated circuit generating a self-timing power start-up reset, comprising:

a power-up detection circuit with an input and an output, said input of said power-up detection circuit connectable to a source of power, said output of said power-up detection circuit producing a reset pulse after said source of power is connected to said input of said power-up detection circuit, said power-up detection circuit further comprising:

a voltage supply rail connected to said input of said power-up detection circuit;

a reference potential;

a first p-channel transistor having a source-drain path and a gate, said source of said first p-channel transistor connected to said voltage potential, and said gate of said first p-channel transistor connected to said drain of said first p-channel transistor;

a first n-channel transistor having a drain-source path and a gate, said drain-source of said first n-channel transistor connected between said drain of said first p-channel transistor and said reference potential, and said gate of said first n-channel transistor connected to said drain of said first n-channel transistor;

a second p-channel transistor having a source-drain path and a gate, said source of said second p-channel transistor connected to said voltage supply rail, and said gate of said second p-channel transistor connected to said gate of said first p-channel transistor;

a second n-channel transistor having a drain-source path and a gate, said drain-source of said second n-channel transistor connected between said drain of said second p-channel transistor and said reference potential, and said gate of said second n-channel transistor connected to said gate of said first n-channel transistor;

a third p-channel transistor having a source-drain path and a gate, said source-drain of said third p-channel transistor connected between said voltage supply rail and said drain of said second p-channel transistor, and said gate of said third p-channel transistor connected to said reference potential;

a fourth p-channel transistor having a source-drain path and a gate, said source of said fourth p-channel transistor connected to said voltage supply rail, and said gate of said fourth p-channel transistor connected to said gate of said first p-channel transistor;

a third n-channel transistor having a drain-source path and a gate, said drain-source of said third n-channel transistor connected between said drain of said fourth p-channel transistor and said reference potential, and said gate of said third n-channel transistor connected to said drain of said third p-channel transistor;

a fourth n-channel transistor having a drain-source path and a gate, said drain-source of said fourth n-channel transistor connected to said reference potential, and said gate of said fourth n-channel transistor connected to said drain of said fourth p-channel transistor;

a Schmitt trigger with an input and an output, said input of said Schmitt trigger connected to said drain of said fourth p-channel transistor, and said output of said Schmitt trigger connected to said output of said power-up detection circuit;

a frequency divider with an input, a first output and a second output, said input of said frequency divider connected to said output of said power-up detection circuit, said first output of said frequency divider producing a system clock and said second output of said frequency divider producing a Div_n_clk pulse; and a bistable circuit with a first input, a second input, a third input and an output, said first input of said bistable circuit connected to a logical one voltage level, said second input of said bistable circuit connected to said second output of said frequency divider, said third input of said bistable circuit connected to said output of said power-up detection circuit, and said output of said bistable circuit providing a system reset signal.

2. The circuit of claim 1, wherein said integrated circuit is implemented in CMOS technology.

3. The circuit of claim 2, wherein said source of power may range from 2.2 volt to 3.7 volt for said CMOS technology.

4. The circuit of claim 1, wherein said integrated circuit is implemented in BiCMOS technology.

5. The circuit of claim 4, wherein said source of power may range from 4.5 volt to 5.5 volt for said BiCMOS technology.

6. The circuit of claim 1, wherein said integrated circuit consumes a current of less than 20 microampere.

7. The circuit of claim 1, wherein said power-up detection circuit will detect power-up when its voltage slope is at least 0.8 volt per microsecond.

8. The circuit of claim 7, wherein said voltage slope can be selected by the choice of an RC time-constant, represented by the internal resistance of said source of power and a power supply de-scoupling capacitor.

9. The circuit of claim 1, wherein said bistable circuit is a D-type flip-flop.

10. The circuit of claim 1, wherein said Div_n_clk pulse is generated after a count of at least two.

11. The circuit of claim 1, wherein said fourth n-channel transistor provides the function of a capacitor.

12. The circuit of claim 1, wherein said frequency divider further comprises:

an oscillator generating an oscillating signal; and a divider circuit reducing the frequency of said oscillating signal.

13. The circuit of claim 12, wherein said oscillator is an external crystal clock oscillator.

14. The circuit of claim 12, wherein said divider circuit comprises a series of flip-flop dividers.

* * * * *

UNITED STATES PATENT AND TRADEMARK OFFICE
CERTIFICATE OF CORRECTION

PATENT NO. : 6,085,327
DATED : July 4, 2000
INVENTOR(S) : Yap Hwa Seng, Uday Dasgupta, Chan Chee Oei It is certified that error appears in the above-identified patent and that said Letters Patent is hereby corrected as shown below:

Column Six, line 55, please replace "de-scoupling" with --de-coupling--.

Signed and Sealed this

First Day of May, 2001

Attest:

NICHOLAS P. GODICI

Attesting Officer     Acting Director of the United States Patent and Trademark Office